United States Patent [19]
McDaniel et al.

[11] Patent Number: 6,166,985
[45] Date of Patent: Dec. 26, 2000

[54] INTEGRATED CIRCUIT LOW LEAKAGE POWER CIRCUITRY FOR USE WITH AN ADVANCED CMOS PROCESS

[75] Inventors: Bart R. McDaniel; Lawrence T. Clark, both of Phoenix, Ariz.

[73] Assignee: Intel Corporation, Santa Clara, Calif.

[21] Appl. No.: 09/302,729

[22] Filed: Apr. 30, 1999

[51] Int. Cl.⁷ .................................................. G11C 8/00
[52] U.S. Cl. ..................................... 365/230.06; 365/226
[58] Field of Search .................................. 365/226, 227, 365/228, 229, 189.09, 189.11, 230.06

[56] References Cited

U.S. PATENT DOCUMENTS

| | | | |
|---|---|---|---|
| 5,274,601 | 12/1993 | Kawahara et al | 365/230.66 |
| 5,486,774 | 1/1996 | Douseki et al. | 326/33 |
| 5,726,562 | 3/1998 | Mizuno | 323/312 |
| 5,726,946 | 3/1998 | Yamagata et al. | 365/226 |
| 5,764,566 | 6/1998 | Akamatsu et al. | 365/227 |
| 6,009,034 | 12/1999 | Manning | 365/228 |

FOREIGN PATENT DOCUMENTS 198 11 353
    C1   7/1999   Germany .

*Primary Examiner*—Vu A. Le
*Attorney, Agent, or Firm*—Blakely, Sokoloff, Taylor & Zafman LLP

[57] ABSTRACT

In one embodiment, the present invention provides a circuit that includes a core circuit and a control circuit coupled to the core circuit. The control circuit reduces a leakage current in the core circuit when the core circuit is in a Sleep mode. The control circuit maintains a logic state of the core circuit when the core circuit is in a Drowsy mode.

29 Claims, 5 Drawing Sheets

INTEGRATED CIRCUIT LOW LEAKAGE POWER CIRCUITRY FOR USE WITH AN ADVANCED CMOS PROCESS

BACKGROUND OF THE INVENTION

I. Field of the Invention

The present invention relates to the field of conservation of power in electronic circuits. More specifically, the present invention relates to circuits with reduced leakage currents.

II. Background Information

With the advent of deep sub-micron Complementary Metal Oxide Semiconductor (CMOS) processes, the sub-threshold current leakage current $I_{off}$ seen in a turned-off transistor has increased dramatically from that of earlier CMOS processes. The finer the sub-micron features are—i.e., smaller line widths and process features, the more pronounced the increase in a Metal Oxide Semiconductor Field Effect Transistor (MOSFET) drain's leakage current $I_{off}$. This high $I_{off}$ has led to very high cumulative currents, ($I_{off(chip)}$) arising in very large scale integrated (VLSI) circuits that are in an Idle or inactive state. An idle state is defined as a state in which no switching activity occurs and in which no DC bias currents is present.

The leakage current ($I_{off(chip)}$) has risen to a point where new generation products of integrated circuit (IC) families may not meet the $I_{off(chip)}$ current specifications that where achievable in earlier processes. In earlier processes, it was possible to achieve $I_{off(chip)}$ currents in the 10s to 100s of microamperes for a microprocessor having approximately 2 million transistors, for example. For higher performance microprocessors fabricated by way of low feature sub-micron processes, $I_{off(chip)}$ may be in a range of approximately 10–100 milliamperes for ICs that feature finer geometry. This higher leakage current is between 100 to 1,000 times the leakage current of earlier sub-micron devices and causes a great problem for IC parts, such as microprocessors, for example, used in applications requiring ultra-low standby power.

FIG. 1 depicts a drain-to-source current ($I_{ds}$) as a function of gate-to-source voltage ($V_{gs}$) for a Metal Oxide Semiconductor Field Effect Transistor (MOSFET). Ideally, when $V_{gs}$ of the MOSFET is below the threshold voltage ($V_t$), i.e., $V_{gs} - V_t < 0$, Ids equals 0. In reality, $I_{ds}$ is not equal to 0 for gate voltages that are lower than $V_t$ as one may see from graph 102 representing Log $I_{ds}$ as a function of $V_{gs}$. When $V_{gs}$, equals 0 volts, a leakage current $I_{off1}$ flows through the transistor.

In many instances, such as in the case of mobile devices that are powered by batteries, the process features are scaled down and the power supply levels are collapsed to lower and lower voltages, so that the batteries may last longer. As the process scales down and the supply voltages are reduced to lower voltages, drain-to-source voltages ($V_{ds}$) are pushed down. In these cases, for lower supply voltages $V_{dd}$, $V_t$ is also lowered to make the process faster. Also, for finer processes such as sub-micron CMOS geometry processes, $V_{dd}$ is decreased to keep electrical or electromagnetic fields from punching through the transistor's channel region. If $V_t$ was not lowered, a relatively large voltage would need to be applied to the gate of a MOSFET to turn that transistor on. This would cause a degradation in the performance of the electronic circuit to the sub-optimal MOSFET characteristic. As $V_t$ is lowered, the leakage current increases to $I_{off2}$ as one may see from graph 104. The leakage current $I_{off2}$, for the state where $V_t$ is lowered, depicted by graph 104, is higher than the leakage current $I_{off1}$ for the state depicted by graph 102. As $I_{off}$ goes up, the power consumed by the electronic circuit incorporating the MOSFET also goes up. It is desirable to reduce power consumption for fine feature CMOS processes such as sub-micron CMOS processes.

SUMMARY OF THE INVENTION

In one embodiment, the present invention provides a circuit that includes a core circuit and a control circuit coupled to the core circuit. The control circuit maintains a logic state of the core circuit when the core circuit is in a Drowsy mode.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

One embodiment of the present invention is an integrated circuit (IC) with a control circuit that controls a leakage current. This circuit may be used in connection with fine features Complementary Metal Oxide Semiconductor (CMOS) processes such as advanced deep sub-micron CMOS processes, to reduce the power consumed by core CMOS circuits when these circuits are in an Idle Mode—i.e., the circuits do not operate dynamically and do not have DC bias currents. To conserve power and also retain logical state(s) of the core circuit when desired, the embodiment of the circuit according to the present invention may be set in two states (modes): active Sleep mode and a state retentive (Drowsy) mode respectively. The embodiment of the circuit according to the present invention includes a core circuit coupled to a control circuit. The control circuit substantially reduces a leakage current in the core circuit when the core circuit is in a Sleep mode. Also, the control circuit maintains a logic state of the core circuit when the core circuit is in a Drowsy mode.

During the Sleep mode, the control circuit acts to bring the core circuit to its lowest possible state of leakage current. In this mode, the logic state of the memory elements on the IC, including RAM memory, latches, and flip-flops, is likely lost because the current paths are dominated by leakage currents as opposed to those currents developed by the transistors that are biased "ON." During Sleep mode, the circuit is actively biased at $V_{dd}$ as opposed to bringing the $V_{dd}$ power supply to ground potential externally. During Drowsy mode, the control circuit acts to provide enough current to ensure that the memory elements of the core circuit retain their stored logical state, yet without consuming the power otherwise consumed when the memory elements are in Idle or active operation. For example, the current flowing through the devices of the core circuit during the Drowsy mode is approximately 20 to 100 times less than the current flowing through devices in the Idle mode of operation. The advantage of Drowsy mode over the Sleep mode is that the circuit may be brought from Drowsy mode to full active operation without incurring the loss of a machine "state." This is very important for proper operation of microprocessors because in microprocessors implementing the Drowsy mode, it would not be necessary to back up the machine state of the microprocessor in external memory.

Figure 2:
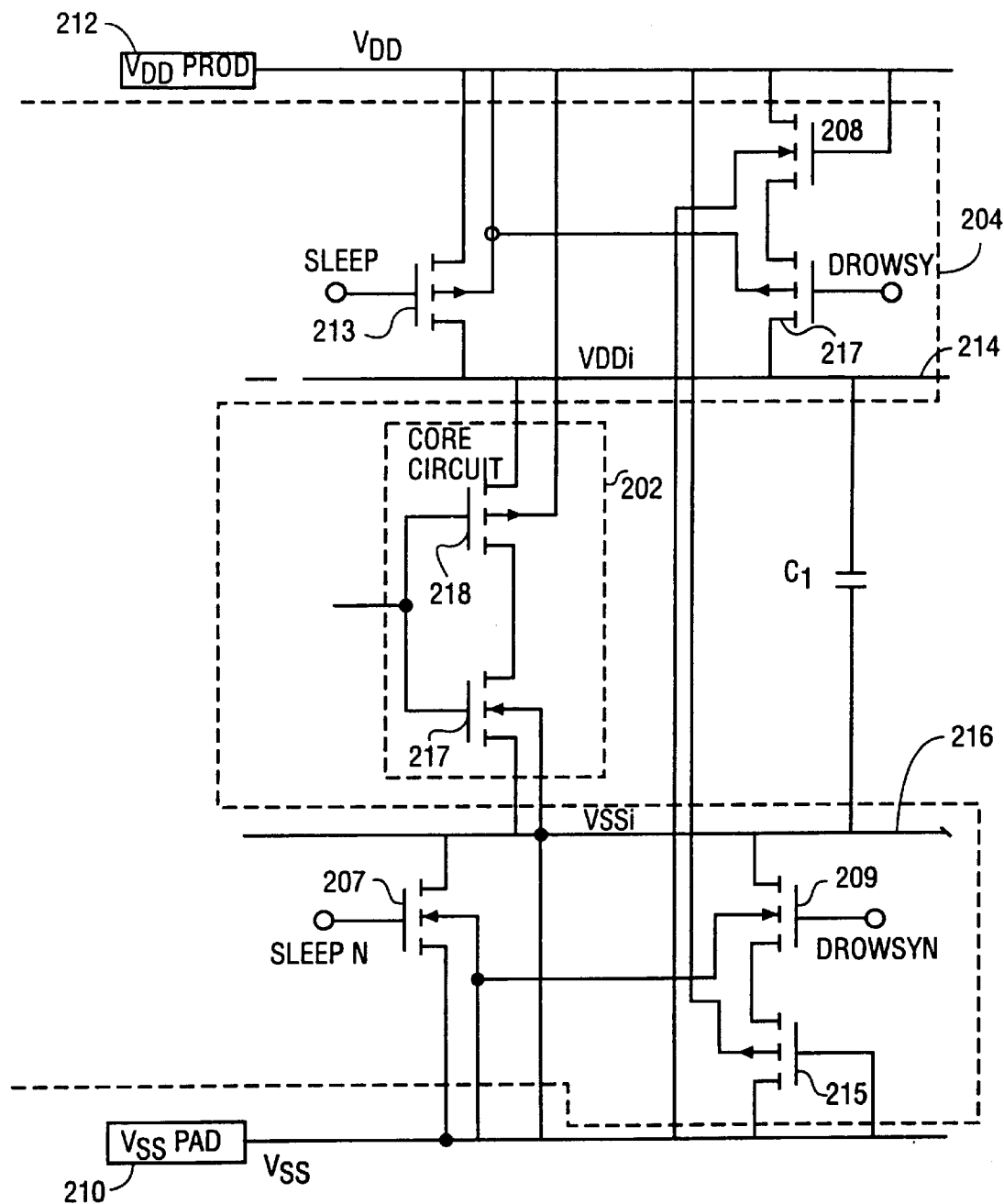
FIG. 2 illustrates one embodiment of a leakage current control circuit according to the present invention.

According to the present invention, FIG. 2 illustrates one embodiment of a circuit 200 including an integrated leakage control circuit 204. Circuit 204 may be used in connection with electronic circuits that implement advanced Complementary Metal Oxide Semiconductor (CMOS) processes. The core circuit 202 includes electronic devices such as transistors that implement the intended function of this circuit. Control circuit 204 controls a leakage current through core circuit 202 when the core circuit 202 is in one of a Sleep and Drowsy modes.

For one embodiment of the circuit according to the present invention, core circuit 202 includes an inverter, though circuit 202 may include other types of circuits. Inverters or single stack structures, are main sources of high leakage current paths in integrated circuits. For example, inverter structures generate a large part of the leakage current in contemporary microprocessors. Typically, an inverter such as a logic CMOS inverter includes a single P-Metal Oxide Semiconductor Field Effect Transistor (MOSFET) and a single N-MOSFET. In operation, one of these two MOSFETs is biased ON while the other MOSFET is biased OFF. The leakage current is determined by the $I_{off}$ of the device (P MOSFET or N MOSFET) that is turned off.

Figure 1:
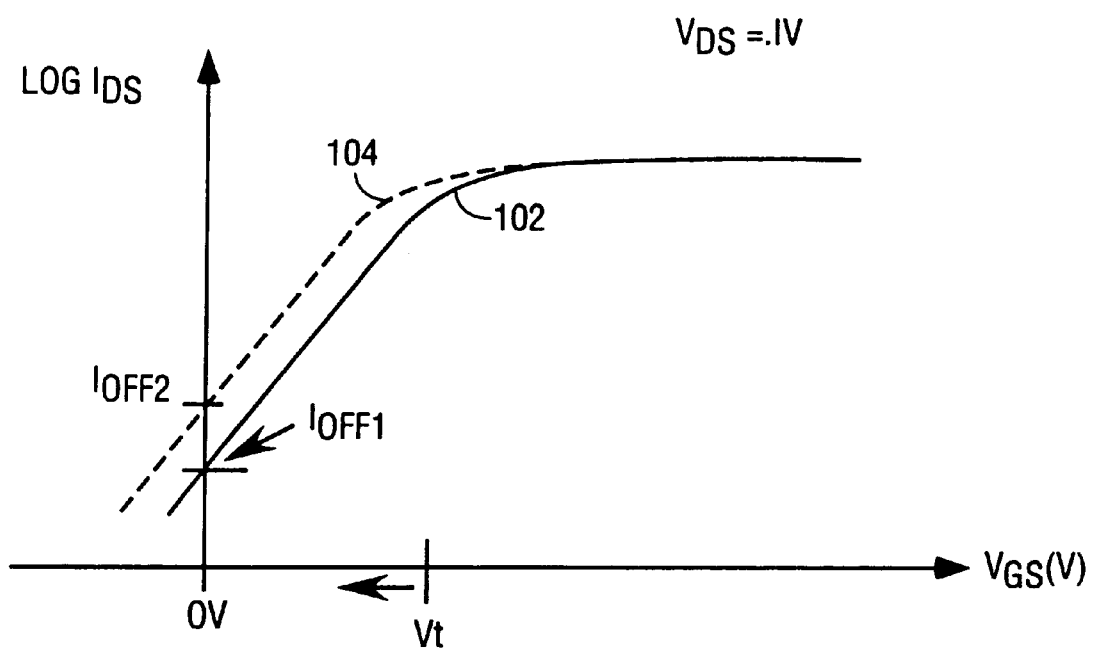
FIG. 1 is a graph of a drain-to-source current ($I_{ds}$) as a function of gate-to-source voltage ($V_{ds}$) in a metal oxide semiconductor field effect transistor (MOSFET)

When the inverter or single stack structure is in a state where the overall voltage drop across the inverter, or single stack structure, is at full potential $V_{dd}$ or ($V_{dd}-V_{ss}$), for the case where $V_{ss}$ is different from zero, and the voltage between the source and the bulk $V_{sb}$ is at zero volts, the inverter dissipates a high amount of leakage power. The overall voltage drop is the voltage drop between the drain of the MOSFET coupled to the higher supply rail $V_{dd}$ and the source of the MOSFET coupled to the lower supply rail $V_{ss}$. To overcome the effect of the high amount of leakage power dissipated, the embodiment of circuit 200 according to the present invention is configured such that when core circuit 202 is not active the source-to-bulk voltage $V_{sb}$ is adjusted to a voltage value that causes the threshold voltage $V_t$ of the OFF MOSFET of the core circuit 202 to significantly decrease. In the embodiment described herein, this is done by reverse-biasing the bulk-to-source junction. An increase in $V_{sb}$ also causes an increase in $V_t$ because $V_t$ varies with the square root of ($2\phi_s+V_{sb}$), where $\phi_s$ is the Fermi level. An increase in $V_t$ effects a decrease of the leakage current $I_{off}$ as explained earlier in the discussion related to FIG. 1. Therefore, control circuit 204 ensures that when core circuit 202 is in Sleep mode, $V_{sb}$ for the OFF core transistor decreases thereby leading to the above-explained decrease in $I_{off+}$.

Control circuit 204 provides and additional mechanism by which $I_{off}$ for the core circuit is decreased. This causes a reduction in the $V_{ds}$ voltage of the OFF core transistor(s) of core circuit 200. Reducing $V_{ds}$ across the OFF transistor(s), effects a great savings in $I_{off}$. The decrease in the $V_{ds}$ for the transistors of the core circuit that leak power, (hereinafter referred to as "OFF core transistors") causes a decrease in the $I_{off}$ for those transistors due to the exponential dependence of $I_{off}$ with $V_{ds}$. The reduction in the $V_{ds}$ for the OFF core transistor occurs mainly as the overall voltage drop across the core circuit's stacked elements, such as the PMOSFET 218 and the NMOSFET 217, is reduced.

The reduction in the overall voltage drop across core circuit 202 is provided in the following way. Circuit 200 includes a pair of internal supply rails 214 ($V_{ddi}$) and 216 ($V_{ssi}$) that provide power to core circuit 202. In Sleep mode, control circuit 204 causes a "collapse" of the internal supply rails 214 and 216 to voltages ($V_{ddi}$ and $V_{ssi}$) that are lower in absolute value than the voltages of the external rails $V_{dd}$ and $V_{ss}$. As a result, $V_{ds}$ for the OFF core transistor becomes smaller with the collapse of the internal power rails 214 and 216. For one embodiment, the collapse of the internal supply rail voltages and the control of the $I_{off}$ is provided by the pairs of current controlling transistors (207, 209) and (213, 217). The current controlling transistors 207, 209, and 215 operate between $V_{ssi}$ and $V_{ss}$ while current controlling transistors 213 and 217 and 208 operate between $V_{ddi}$ and $V_{dd}$.

When circuit 200 is in a Sleep mode, transistors 207, 209, 213 and 217 are turned off by setting these transistors' gate-to-source voltages ($V_{gs}$) to sub-threshold voltage values. In Sleep mode, the leakage is controlled by transistors 207 and 213. The contribution of transistors 207 and 213 is a dominant part of the overall leakage current $I_{off}$ that flows through the OFF core transistors because these transistors are much wider than transistors 208, 209, 217, and 215. Therefore, the leakage current generated through transistors 217 and 209 is negligible relative to the leakage current through transistor 207 and 213.

The leakage current $I_{off}$ flowing through transistors 207 and 213 causes a voltage drop ($V_{ds}$) between the drains and the sources of transistors 207 and 213 on the order of hundreds of millivolts. As a result of the $V_{ds}$ developed across transistors 207 and 213 during Sleep mode, internal supply rails 214 and 216 collapse in voltage relative to the voltage of these internal supply rails had both transistors 207 and 213 been turned on. The collapse of the internal power rails 214 and 216 leads to a decrease in the $V_{ds}$ for core transistors 218 and 217. This decrease in $V_{ds}$ for transistors 217 and 218 results in a lower $I_{off}$ for these transistors as $I_{off}$ has an exponential relation with $V_{ds}$. For one embodiment, the difference between $V_{dd}$ and $V_{ss}$ is approximately 1.3 volts while the collapse of the internal supply rails 214 and 216 causes a voltage drop therebetween to be in a range of approximately 1–200 millivolts. Also, for one embodiment of circuit 200, there is only one internal power rail—i.e. either 214 or 216. In this case, the overall voltage across the transistors of the core circuit may drop too, as a result of the collapse of the internal supply rail. Furthermore, note that one embodiment of the present invention may be implemented where there is more than one pair of internal rails—i.e., multiple internal supply rails that may be used for different structures of the core circuit.

The voltage drop $V_{ds}$ across transistors 207 and 213 causes a "passive" $V_{sb}$ built up in the N-MOSFET and P-MOSFET devices 218 and 217 of the core circuit 202 for the following reasons. The bulks and sources for both NMOSFET 217 and PMOSFET 218 of the core are coupled to different supply voltages. The source of the NMOSFET 217 is coupled to $V_{ssi}$, while its bulk is coupled to $V_{ss}$. The source of the PMOSFET 218 is coupled to $V_{ddi}$ while its bulk is coupled to $V_{dd}$. The passive $V_{sb}$ built up in transistors 217 and 218 of the core circuit causes their threshold voltage $V_t$ to shift towards a larger value. Because $I_{off}$ is inversely proportional with $V_t$, $I_{off}$ decreases with an increase in $V_t$.

The internal supply rails 214 and 216 adaptively bias core transistors 217 and 218 to ensure a low $I_{off}$ current during the Sleep mode. This results from an inherent negative feedback mechanism in which a higher leakage current $I_{off}$ in core circuit 202 causes a greater $V_{ds}$ drop in Sleep mode control transistors 207 and 213. The greater $V_{ds}$ drop in transistors 207 and 213 "leaves" less voltage between internal supply rails 214 and 216 as the voltage difference between $V_{dd}$ and $V_{ss}$ is fixed. Therefore, a lower $V_{ds}$ "remains" for core transistors 217 and 218. The lower $V_{ds}$ for transistors 217 and 218 causes a lower $I_{off}$ current through these transistors.

The ratio of the effective widths of Sleep control transistors 207 and 213 to that of core transistors 217 and 218 is a controlling parameter in determining $I_{off}$. Lower ratios of the above-mentioned widths cause greater $V_{ds}$ drops across transistors 207 and 213 that cause further reduction in the $I_{off}$ current, as the current is dominated by the $I_{off}$ of transistors 207 and 213. This $I_{off}$ current is first-order dependent on the widths of the two transistors 207 and 213. Because transistors 207 and 213 provide the core current during active mode operation, the above-mentioned ratio must be balanced taking into account both Sleep mode and active mode operation specifications. For one embodiment, a 10% ratio between the width of the Sleep control transistors 207, 213 and of the core transistors 217, 218 respectively, may bring the $I_{OFF}$ current during Sleep mode to a desirable range. In active mode, this ratio would lead to less than 50 millivolts total voltage drop across devices 207 and 213, with the aid of adequate on-die decoupling capacitance $C_1$ between $V_{ddi}$ and $V_{ssi}$.

When the circuit 200 is in the Drowsy mode an additional amount of current $I_{OFF}$, over that of the Sleep mode, is provided to insure that the $V_{ddi}$ to $V_{ssi}$ potential across core circuit 202 may not collapse to a point beyond which $V_{ds}$ and hence $V_{gs}$ for the core ON transistor is so low that the conductance of this transistor may become less than that of the OFF core transistor. This additional current insures that the $V_{ddi}$ to $V_{ssi}$ potential develops sufficiently so that ON transistors have sufficient $V_{gs}$ bias and their conductance dominates over the conductance of the OFF transistors. The additional amount of current provided by control circuit 204 in the Drowsy mode insures that no internal nodes may be "flipped" in a logic state due to $I_{off}$ currents in all of the logic gates of the core circuit. As no memory element may lose its state due to "current starvation," the Drowsy mode has the property of being state retentive while consuming minimal $I_{off}$ current.

The mechanism to provide the additional $I_{off}$ current for core devices in Drowsy mode involves transistors 209, 215, 208 and 217. Transistors 209 and 217 act as switches to enact the Drowsy mode while diode-connected transistors 208 and 215, operated in saturation, provide a controlled additional current for the Drowsy mode. The saturation current level is controlled by the drain-source potential ($V_{ds}$) determined by the differences ($V_{dd}-V_{ddi}$) and ($V_{ss}-V_{ssi}$) and by the widths of transistors 208 and 215. For one embodiment, the widths of transistors 208 and 215 may be set to 0.1% of the effective widths of the core transistors 217 and 218. This ensures a Drowsy current level in the low hundreds of microamperes for a very low sub-micron CMOS process, while ensuring that a robust $V_{ddi}$ to $V_{ssi}$ potential is developed. This arrangement is also adaptive in nature—the $V_{ds}$ of transistors 208 and 215 rises with a square root dependence of $I_{ds}$ ($I_{off}$) to provide the current demanded by the core circuit. This is another negative feedback mechanism that provides the minimal current necessary to robustly bias the core circuit 202. This mechanism also provides additional current in the event where "leakage defects" are present in some of the transistors of circuit 200.

Figure 3:
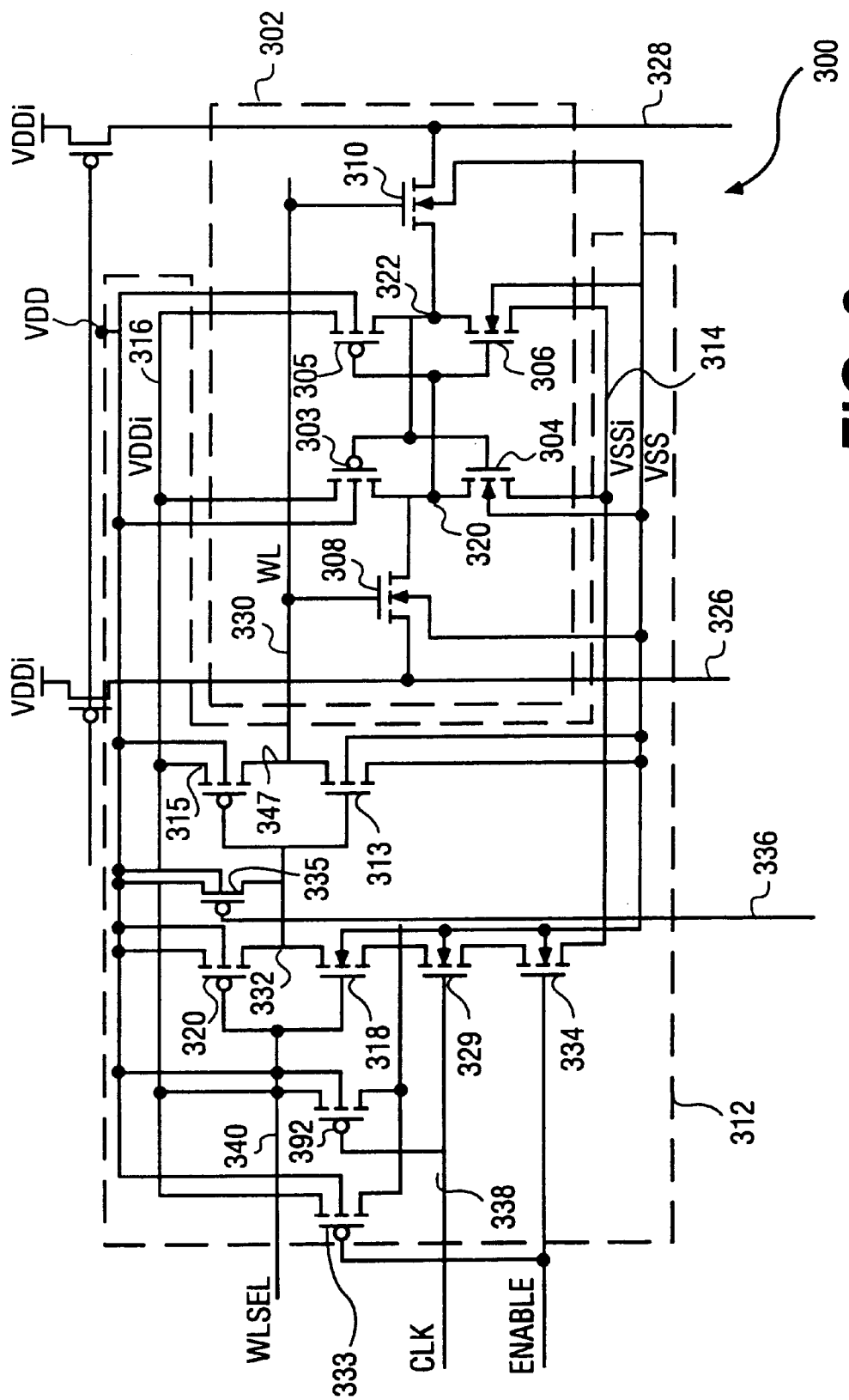
FIG. 3 illustrates a Static Random Access Memory (SRAM) circuit that uses one embodiment of the leakage current control circuit according to the present invention.

FIG. 3 illustrates a circuit 300 that utilizes one embodiment of a circuit for reducing leakage current according to the present invention. Circuit 300 includes a plurality of Static Random Access Memory (SRAM) cells. One such SRAM cell 302 is shown within the dotted line. SRAM cell 302 includes two cross-coupled inverters that are made up of pairs of MOSFETs (303, 304) and (305, 306). The SRAM cell 302 also includes pass transistors 308 and 310 that are coupled to output nodes 320 and 322, respectively, of the SRAM cell. Pass transistors 308 and 310 are also coupled to bit lines 326 and 328 respectively. Circuit 300 may be used in conjunction with the previously described leakage control circuit 204 shown in FIG. 2 to cause a reduction of the leakage current of the cross-coupled inverters of the SRAM cell 302 when this cell is in Sleep mode and further to provide an additional current when this cell is in the Drowsy mode.

In addition to SRAM cell 302, circuit 300 includes a wordline (WL) driver circuit 312 that allows reduced leakage current in the SRAM circuit. The wordline (WL) driver circuit drives the SRAM wordline (WL) 330. Wordline driver 312 includes internal power rails $V_{ddi}$ 314 and $V_{ssi}$ 316 that work in the same manner as the internal power rails explained in connection with the embodiment of FIG. 2. Additionally, circuit 312 includes two inverters. The first inverter includes transistor 313 and 315 and the second inverter includes transistors 318 and 320.

Circuit 312 is designed to reduce the leakage currents through pass transistors 308 and 310 when these transistors are OFF. Moreover, circuit 312 consumes a limited amount of power when some of its devices are turned off. Assume that the SRAM cell 302 is in a state where node 320 is set to a logic 1 while node 322 is set to logic 0. Therefore, the pass transistor 308 has a logic 1 at the drain thereof. Pass transistor 308 also has a logic 1 at the source thereof, which is coupled to bit line 326, as the bit lines are initially precharged to a voltage $V_{ddi}$ equal to the voltage at which the higher internal supply rail 316 is set. Bit lines 326 and 328 are kept at the precharge voltage of $V_{ddi}$ during any period of inactivity that includes the powerdown modes sleep, idle, and drowsy. Transistor 308 therefore has substantially the same voltage coupled at the drain and source thereof.

When the wordline WL 330 is set to logic 0, transistor 308 is in cutoff. However, because both the drain and the source of transistor 308 have equal voltages coupled thereto—i.e., $V_{ddi}$, $V_{ds}$ across transistor 308 is approximately 0 volts. Therefore, no leakage current ($I_{off}$) flows through transistor 308.

Pass transistor 310 has its drain coupled to bit line 328 that is precharged to $V_{ddi}$. The source of transistor 310 is set to logic 0 by way of transistor 306 that pulls that node to the lower internal rail $V_{ssi}$. This is where the complementary voltage, i.e., logic 0, is stored on the other side of the SRAM cell. To reduce the leakage current through pass transistor 310, circuit 312 provides a way of biasing the gate of transistor 310 at the lower external rail $V_{ss}$ instead of the lower internal rail $V_{ssi}$. Consequently, the gate-to-source voltage ($V_{gs}$) for transistor 310 has a sub-threshold value as the source voltage at node 322 is approximately equal to $V_{ssi}$ and the voltage at the gate is approximately equal to $V_{ss}$. The sub-threshold gate-to-source voltage ($V_{gs}$) contributes to the lowering of the leakage current $I_{off}$ expressed by the formula:

$$I_{DS} = \left(\frac{Z}{L_{eff}}\right)\frac{aC_I}{2B^2}\left(\frac{n_I}{N_A}\right)^2 (1 - e^{-\beta VD})e^{\beta \psi_s (\beta \psi_3)^{-0.5}}$$

where $$\psi_s = (V_{gs} - V_{FB}) - \frac{a^2}{2\beta}\left\{\left[1 + \frac{4}{a^2}(\beta V_{gs} - \beta V_{FB} - 1)\right]^{0.5} - 1\right\}$$

For more detailed explanations regarding these formula please see *Physics of Semiconductor Devices,* by S. M. Sze (Wiley Publications 1969). As one may see from the above formula, the leakage current depends exponentially on the $V_{gs}$. Because the leakage current for transistor 310 now constitute approximately 40% of the leakage current flowing through the SRAM cell, a saving of actual power of approximately 40% for the SRAM circuit (array) may be achieved depending upon the operating voltage and the width ratios of transistors.

A leakage current through transistor 306 is reduced by way of the mechanism according to which the internal supply rails are collapsed causing a source-bulk voltage $V_{sb}$ to be developed for the transistors of the SRAM cell. This power saving is analogous to that in the core circuit described previously in connection with FIG. 2. The symmetry of the SRAM cell produces the same leakage current ($I_{OFF}$) reduction when the stored state within the cell is opposite that described above, i.e., when node 320 is set to a logic 0 and node 322 is set to a logic 1.

To set the wordline 330 to $V_{ss}$ instead of $V_{ssi}$, the two inverters are used in the following manner. The first inverter, which includes transistors 313 and 315, has the source of transistor 313 set to $V_{ss}$ instead of $V_{ssi}$. When a logic 1 voltage is applied to the gates of transistors 313 and 315, transistor 313 pulls the voltage at a drain thereof, which is coupled to wordline 330, to $V_{ss}$ instead of $V_{ssi}$. This causes wordline 330 to be set to $V_{ss}$ thereby lowering the leakage of pass transistor 310 to the point where it may be considered negligible.

The second inverter includes transistors 318 and 320. Transistor 320 has a source thereof coupled to $V_{dd}$ instead of $V_{ddi}$. When the wordline select signal WLSEL, driven through line 340, is set to $V_{ssi}$, transistor 320 pulls the output node 332 of the second inverter to a voltage value substantially equal to $V_{dd}$ as the source of transistor 320 is coupled to $V_{dd}$. Because node 332 is coupled to the gates of transistors 313 and 315, the gate-source voltage for transistor 315 has a sub-threshold voltage value as $V_{dd}$ is greater than $V_{ddi}$. This causes the leakage of transistor 315 to be considerably lower than it would otherwise be because the gate-to-source voltage $V_{gs}$ for this transistor is positive. The positive $V_{gs}$ lowers the leakage current exponentially, as the PMOS device is turned more on by negative $V_{gs}$ and more off by positive $V_{gs}$. The above-mentioned equations expressing the dependency of the $I_{off}$ with $V_{gs}$ are applicable to the PMOS devices, but with reversed polarities as is well known to those skilled in the art. In this way, it is ensured that the leakage current through the relatively wide device 315 is not unduly exacerbated by the higher $V_{ds}$ created by having the drain of transistor 315 coupled to $V_{ss}$ rather than to $V_{ssi}$. Otherwise, this larger leakage current might substantially cancel the gains of having the wordline 330 at $V_{ss}$ for the attached SRAM cell 302. Note that the SRAM is likely to have many such SRAM cells attached to wordline 330. In one embodiment, the number of SRAM cells is 140.

The increased leakage that may be produced due to coupling the source of transistor 320 to $V_{dd}$ through device 318 is mitigated by the smaller sizes of transistors 320 and 318. These transistors are large enough to drive the capacitive load presented at node 332—i.e., the gates of devices 315 and 313. Additionally, in the powerdown state, the series stack including devices 318, 329, and 334 produces very little leakage since all three series devices are in cutoff.

Circuit 300 further includes a NAND circuit comprised of transistors 329, 333, 334 and 392. The larger $V_{dd}$ to $V_{ssi}$ voltage to which the second inverter is subjected is dropped through the triple stack comprised of 318, 329 and 334 which are all in the cutoff region of operation in the powered down state. The series combination creates a source-to-body voltage on both of the upper devices 318 and 329 while the $V_{ds}$ of each transistor is produced by dividing the difference ($V_{dd}$-$V_{ssi}$) voltage between them, each transistor seeing a $V_{ds}$ of approximately ($V_{dd}$-$V_{ssi}$)/3.

Transistor 333 is coupled to the double stack of 329 and 334 that have a very low leakage current when these devices are OFF. With this configuration, the total leakage of the WL driver circuit is approximately 30% that of the a conventional WL driver circuit. Consequently, by using this WL driver circuit, leakage is saved not only throughout the array devices, but also considerably in the WL driver circuit itself.

Those skilled in the art will recognize that the node 332 is essentially tri-stated when WLSEL is asserted, but the virtual ground (VGND) 338 is at logic 1, i.e., at Vddi. Node 332 is maintained at the high state by PMOS transistor 335 and the VGND# signal through line 336 which is always driven to the opposite state as VGND signal through line 338. The source of this PMOS "keeper" device 335 is at $V_{dd}$.

Figure 4:
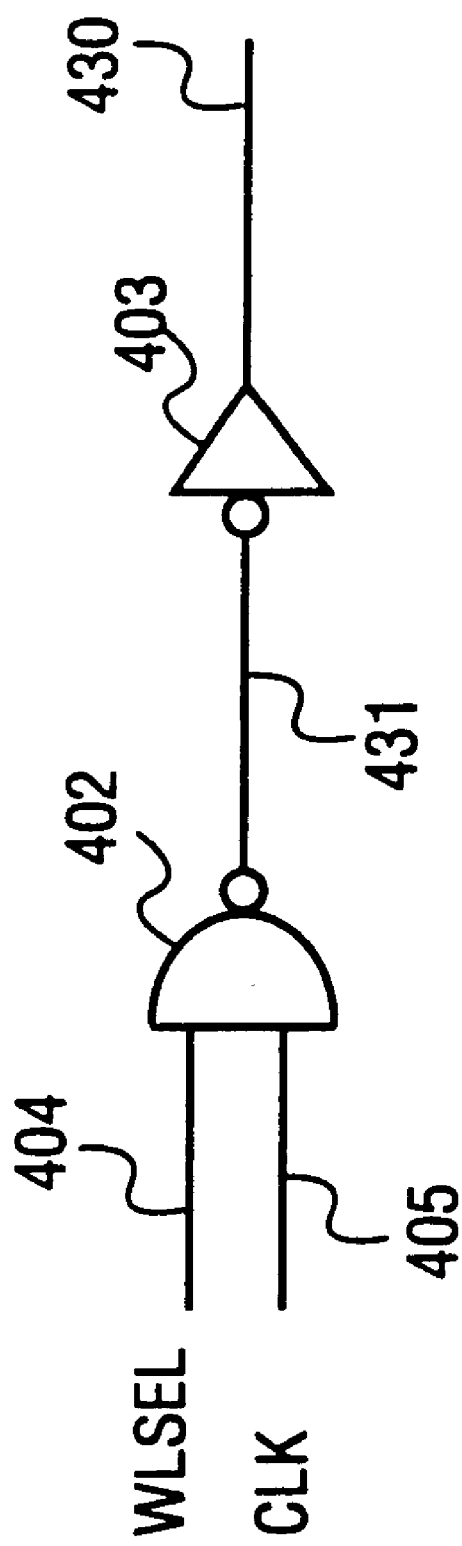
FIG. 4 illustrates wordline driver for use with an SRAM circuit.

In a second embodiment of the invention, a more conventional word line (WL) driver circuit such as that shown in FIG. 4 may be modified to have its leakage reduced in a manner analogous to that described in FIG. 3. The WL driver circuit composed of NAND gate 402 and inverter 403, drives the wordline (WL) 430 based on the select input WLSEL (404) and synchronizing clock input CLK (405). As in the previous embodiment, the $I_{off}$ in the pass transistors of the SRAM cell is reduced by reducing the WL voltage to $V_{ss}$ rather than Vssi. This is accomplished by the circuit configuration shown in FIG. 5.

Figure 5:
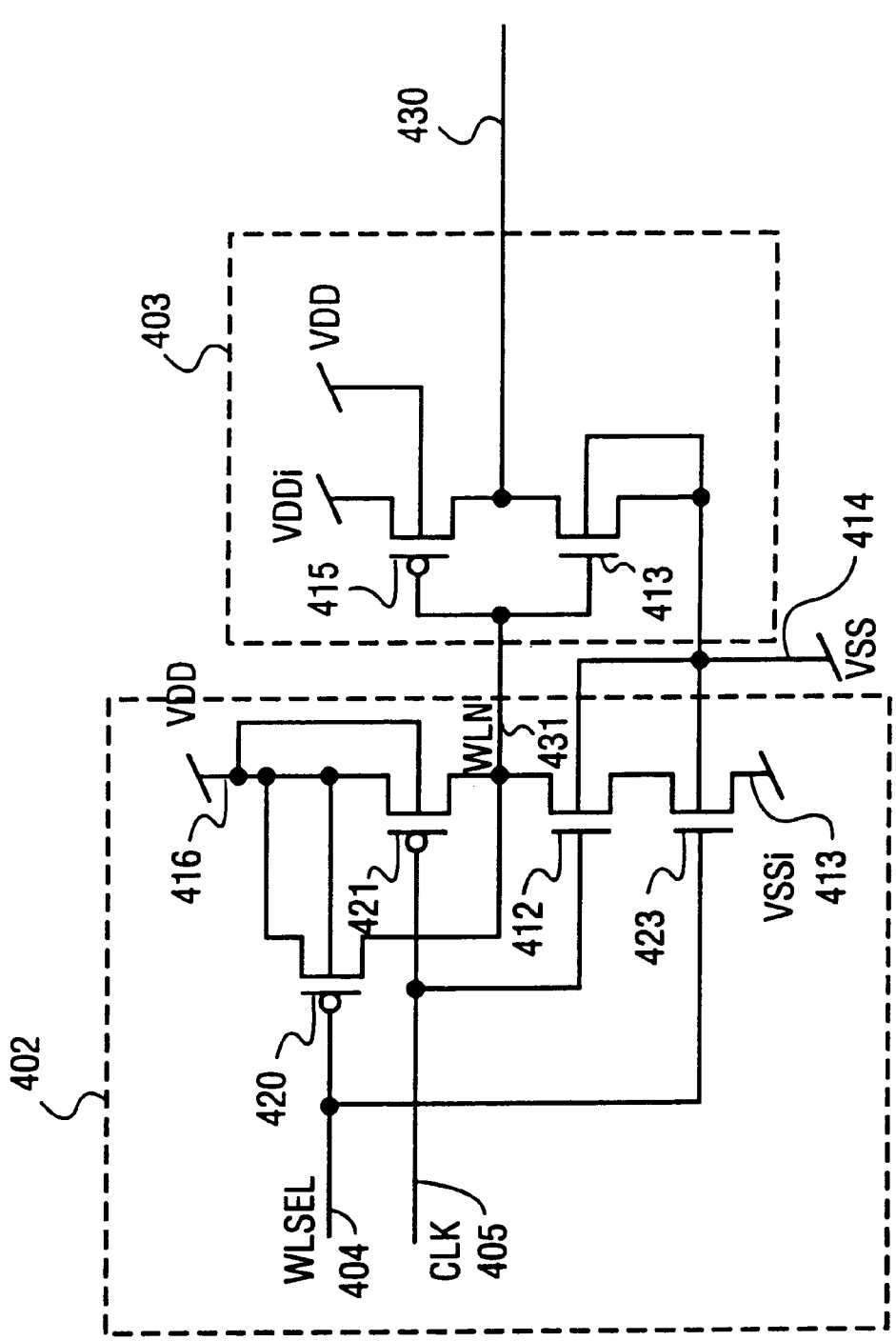
FIG. 5 illustrates a gate level implementation of the wordline driver of FIG. 4.

In FIG. 5, inverter 403 is comprised of the core transistors 415 and 413. Transistor 413 is configured with both its source and bulk coupled to $V_{ss}$ (node 414) so as to drive the WL node to 0V ($V_{ss}$) rather than $V_{ssi}$ as described above. Just as described previously, the higher $V_{ds}$ on transistor 415 would unduly increase the leakage through device 415 if this effect was not mitigated by a positive $V_{gs}$ on PMOS device 415, produced by the NAND gate 402. This voltage is produced by generating WLN signal, via line 431 at $V_{dd}$ rather than $V_{ddi}$ coupling the sources of transistors 420 and 421 to $V_{dd}$. As in the previous embodiment, this limits the Ioff through wordline driver transistor 415.

The increased voltage presented to the series stack comprised of transistors 422 and 423 does not produce a large $I_{off}$ through these transistors as they are configured in a stack configuration, that is efficacious in limiting the leakage current as was described above. While the embodiment described in connection with FIG. 3 may be more efficient at limiting the power consumption due to $I_{off}$ in an SRAM array, the embodiment illustrated in FIGS. 4 and 5, may be desirable due to its simplicity.

In the previous detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A circuit comprising:
    a core circuit; and
    a control circuit, coupled to the core circuit, to reduce a leakage current in the core circuit when the core circuit is in a sleep mode, and to maintain a logic state of the core circuit when the core circuit is in a drowsy mode.

2. The circuit of claim 1 wherein the core circuit includes at least one active device and the control circuit includes a device to adjust a source-to-bulk voltage of the at least one active device.

3. The circuit of claim 2 coupled to a pair of external supply rails wherein the control circuit includes a pair of internal supply rails to bias the core circuit at supply voltages that are smaller in absolute value than supply voltages of the external supply rails.

4. The circuit of claim 3 wherein the source-to-bulk voltage of the at least one active device is substantially equal to a voltage difference between supply voltages of the external supply rails and supply voltages of the internal supply rails.

5. The circuit of claim 4 wherein the control circuit includes a device with an adjustable conductance, coupled between an internal supply rail and a corresponding external supply rail, to generate the bulk-to-source voltage.

6. The circuit of claim 5 wherein the device with adjustable conductance is a MOSFET.

7. The circuit of claim 6 wherein the MOSFET is operated in cutoff when the core circuit is in sleep mode.

8. The circuit of claim 6 wherein the MOSFET has a width substantially smaller than widths of MOSFET transistors of the core circuit.

9. The circuit of claim 1 wherein the core circuit includes at least one active device and the control circuit includes a circuit to reduce a drain-to-source voltage of the at least one active device when the core circuit is in sleep mode.

10. The circuit of claim 9 wherein the circuit to reduce a drain-to-source voltage includes a pair of internal supply rails to bias the core circuit, when the core circuit is in the sleep mode the internal supply rails generating a voltage drop therebetween that is lower than a voltage drop generated between external supply rails when the external supply rails bias the core circuit.

11. The circuit of claim 1 wherein the control circuit includes a device to generate a current to maintain a logic state of the core circuit when the core circuit is in a drowsy mode.

12. The circuit of claim 11 wherein the device to generate a current includes a MOSFET device that operates in saturation.

13. The circuit of claim 11 wherein the control circuit further includes a switch device the switch being turned on when the core circuit is in the drowsy mode, the switch device being turned off when the core circuit is in a sleep mode.

14. A circuit comprising:
    a Static Random Access Memory (SRAM) circuit including at least one wordline and at least one SRAM cell coupled to at least one wordline; and
    a wordline driver, coupled to the SRAM circuit, to drive the at least one wordline.

15. The circuit of claim 14 wherein the wordline driver is coupled to a pass MOSFET that is coupled to the at least one SRAM cell.

16. The circuit of claim 15 wherein the wordline driver configured to generate a gate voltage to a gate of the pass MOSFET so that a gate-to-source voltage $V_{gs}$ for the pass sub-threshold MOSFET has a voltage value.

17. The circuit of claim 14 coupled to a pair of higher and lower external supply rails, the circuit further including a pair of higher and lower internal supply rails wherein a voltage drop between the external supply rails is larger than a voltage drop between the internal supply rails.

18. The circuit of claim 17 wherein the SRAM cell is biased by the higher and lower internal supply rails.

19. The circuit of claim 17 wherein the wordline driver further includes a second inverter that has an input node to receive a wordline select signal and an output node coupled to an input node of the first inverter.

20. The circuit of claim 19 wherein said second inverter is biased between the higher voltage external supply rail and the lower internal supply rail.

21. The circuit of claim 14 further including a control circuit, coupled to the SRAM circuit, to reduce a leakage current in the SRAM circuit when the SRAM circuit is in a sleep mode, to reduce a power consumed by the SRAM circuit, and to maintain a logic state of the SRAM circuit when the SRAM circuit is in a drowsy mode.

22. A circuit comprising:
    a core circuit; and
    a leakage current control circuit, coupled to the core circuit, to reduce leakage current in the core circuit, when the core circuit is in a first mode where power is turned off therefrom and to retain a logic state of the core circuit when the core circuit is in a second mode, a power consumed by the core circuit in the second mode is lower than a power consumed by the core circuit in a third mode when the core circuit is in an active mode.

23. An integrated circuit that includes a core circuit, the integrated circuit comprising:
    a control circuit, coupled to the core circuit, to reduce a leakage current in the core circuit when the core circuit is in a sleep mode, and to maintain a logic state of the core circuit when the core circuit is in a drowsy mode.

24. The integrated circuit of claim 23 wherein the integrated circuit is a microprocessor.

25. A method of controlling power consumption in a circuit, the method comprising:
    reducing a leakage current by reducing a supply voltage that biases the circuit when the circuit is in a sleep mode; and
    generating a current in addition to the leakage current to maintain a logic state of the circuit when the circuit is in a drowsy mode.

26. The method of claim 25 wherein reducing a leakage current includes biasing the circuit by a pair of internal supply rails that have a voltage drop therebetween that is lower than a voltage drop developed between external supply rails that bias the circuit when the circuit is in an active mode.

27. The method of claim 25 wherein reducing the leakage current includes developing a source to bulk voltage for MOSFET devices of the circuit.

28. The method of claim 25 wherein developing a source to bulk voltage includes coupling the bulks of the MOSFET devices to a lower voltage internal supply rail and the sources of the MOSFET devices to a lower voltage external supply rail.

29. The method of claim 25 wherein reducing leakage current includes developing a gate-to-source voltage for MOSFET devices which are exposed to higher drain-to-source voltage magnitudes than supplied by the internal supply rails.

* * * * *